(12) United States Patent
Graves et al.

(10) Patent No.: US 10,397,497 B1
(45) Date of Patent: Aug. 27, 2019

(54) SOLAR INVARIANT IMAGING SYSTEM FOR OBJECT DETECTION

(71) Applicants: Jack E. Graves, Cupertino, CA (US); Clarisse Mazuir, San Jose, CA (US); Bryce J. Remesch, San Jose, CA (US); Lucian Ion, Mountain View, CA (US)

(72) Inventors: Jack E. Graves, Cupertino, CA (US); Clarisse Mazuir, San Jose, CA (US); Bryce J. Remesch, San Jose, CA (US); Lucian Ion, Mountain View, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/055,316

(22) Filed: Aug. 6, 2018

Related U.S. Application Data

(60) Provisional application No. 62/545,018, filed on Aug. 14, 2017.

(51) Int. Cl.
| | |
|---|---|
| *H04N 5/33* | (2006.01) |
| *G01S 17/93* | (2006.01) |
| *G01S 17/89* | (2006.01) |
| *G01S 17/06* | (2006.01) |
| *G06T 7/50* | (2017.01) |

(Continued)

(52) U.S. Cl.
CPC ........... *H04N 5/332* (2013.01); *G01S 7/4808* (2013.01); *G01S 7/51* (2013.01); *G01S 17/06* (2013.01);
(Continued)

(58) Field of Classification Search
CPC .......... G01S 7/4808; G01S 7/51; G01S 17/06; G01S 17/89; G01S 17/936; G06T 7/74;
(Continued)

(56) References Cited

U.S. PATENT DOCUMENTS

| 7,979,172 B2 | 7/2011 | Breed |
|---|---|---|
| 2008/0048887 A1 | 2/2008 | Aoki et al. |

(Continued)

FOREIGN PATENT DOCUMENTS

| JP | 2004052299 A | 2/2004 |
|---|---|---|
| JP | 2005526363 A | 9/2005 |
| JP | 2009042098 A | 2/2009 |

OTHER PUBLICATIONS

Koch et al., "Illumination Technique for Optical Dynamic Range Compression and Offset Reduction", BMVS 2001 doi:10.5244/C.15.31, pp. 293-302, 10 pp.

(Continued)

*Primary Examiner* — Mark R Gaworecki
(74) *Attorney, Agent, or Firm* — Young Basile Hanlon & MacFarlane, P.C.

(57) ABSTRACT

An object detection system includes an infrared light source and an imaging system that generates an image from a portion of the infrared spectrum characterized by full absorption of solar radiation. A control system detects an object using the image, determines a command based on a location of the object, and sends a command to one or more vehicle systems. Another object detection system includes an imaging system that generates a first image based on a visible spectrum and a second image based an infrared spectrum. A control system receives a disparity indication associated with object detection and sends a command to one or more vehicle systems to implement a disparity response based on the disparity indication. The disparity indication includes information that an object is not detected within the first image and that the object is detected within the second image.

20 Claims, 9 Drawing Sheets

(51) Int. Cl.
   *G06T 7/70*      (2017.01)
   *G01S 7/51*      (2006.01)
   *G06T 7/73*      (2017.01)
   *H01L 31/0304*   (2006.01)
   *G01S 7/48*      (2006.01)

(52) U.S. Cl.
   CPC ............ *G01S 17/89* (2013.01); *G01S 17/936* (2013.01); *G06T 7/74* (2017.01); *H01L 31/03046* (2013.01); *G06T 2207/30256* (2013.01); *G06T 2207/30261* (2013.01)

(58) Field of Classification Search
   CPC . G06T 2207/30256; G06T 2207/30261; H01L 31/03046; H04N 5/332
   See application file for complete search history.

(56) References Cited

U.S. PATENT DOCUMENTS

2018/0143639 A1* 5/2018 Singhal ................. B62D 15/00
2018/0217607 A1* 8/2018 Ren ......................... G06K 9/68
2018/0343401 A1* 11/2018 Campbell ............ G08G 5/0069

OTHER PUBLICATIONS

Jansen, Rolf A., et. al., "An Optional Near-Infrared Camera for Theia", Astrophysics Strategic Mission Concept Studies, THEIA/SFC Design Reference Mission, Star Formation Camera & Near-IR Camera, Apr. 21, 2009, 9 pp.

* cited by examiner

SOLAR INVARIANT IMAGING SYSTEM FOR OBJECT DETECTION

CROSS-REFERENCE TO RELATED APPLICATION

This application claims priority to and the benefit of U.S. Provisional Application Ser. No. 62/545,018 filed on Aug. 14, 2017, the entire contents of which are incorporated by reference as if fully set forth.

TECHNICAL FIELD

This disclosure relates generally to imaging systems and, more specifically, to solar-invariant image capture for use in object detection.

BACKGROUND

Vehicle guidance systems, autonomous control systems, and passengers viewing a surrounding environment while operating a vehicle can all rely on imaging systems to improve vehicle operation. Imaging systems can identify objects and track movement of the objects that may intersect an intended vehicle path. Depending on the dynamic range of the imaging system and the optical set up used to capture images of the surrounding environment (e.g., lens set, housing, protective window, type of image sensor, etc.), some types of radiation can blur or blind groups of pixels on an image sensor associated with the imaging system. Blurred or blinded groups of pixels can result in bright spots or blind spots within captured images, for example, when the imaging systems operate solely within a visible spectrum, making identification of objects within these regions difficult.

SUMMARY

One aspect of the disclosed embodiments is an object detection system includes an infrared light source, an imaging system, and a control system. The imaging system may generate an image based on incident light from the infrared light source captured in a portion of an infrared spectrum. The portion of the infrared spectrum may be characterized by full absorption of solar radiation. The control system may detect an object using the image, determine a command for one or more vehicle systems based on a location of the object, and send the command to one or more vehicle systems.

Another aspect of the disclosed embodiments is an object detection system that may include an imaging system and a control system. The imaging system may generate a first image based on incident light captured in a visible spectrum and generate a second image based on incident light captured in an infrared spectrum. The control system may receive a disparity indication associated with object detection and send a command to one or more vehicle systems to implement a disparity response based on the disparity indication. The disparity indication may include information regarding an object that is not detected within the first image and that the object is detected within the second image.

Another aspect of the disclosed embodiments is an object detection and control system that may include an infrared light source, an imaging system, a control system, and an actuator. The imaging system may generate a first image by capturing incident light in a visible spectrum, and generate a second image by capturing incident light from a portion of an infrared spectrum. The portion of the infrared spectrum comprises a band an infrared spectrum having a width of 130 nm or less, and the band of the infrared spectrum may include at least one wavelength from the group of: 1250 nm, 1350 nm, 1450 nm, and 1550 nm. The control system may receive a disparity indication associated with object detection, wherein the disparity indication includes information regarding an object that is not detected within the first image and that the object is detected within the second image, and may determine a command to implement a disparity response based on the disparity indication. The command may cause operation of the actuator.

BRIEF DESCRIPTION OF THE DRAWINGS

The disclosure is best understood from the following detailed description when read in conjunction with the accompanying drawings.

DETAILED DESCRIPTION

An imaging system is described that leverages images generated using incident light captured in particular wavelength bands of an infrared spectrum to isolate an output of an object detection algorithm from natural light phenomena. Some wavelength bands or ranges of solar radiation, such as near or around 1350 nm and 1875 nm, are fully absorbed below the Earth's atmosphere. In particular, the atmosphere heavily attenuates radiation in the specified wavelength bands. Contributions in these bands from external sources (such as from the sun, moon and stars) are entirely attenuated once they pass through the atmosphere to the surface. Sources in these wavelengths that do not pass through this amount of atmosphere are not fully attenuated. This means any system, such as a vehicle or infrastructure installation, using these wavelengths and filtering out the surrounding bands does not have to compete with variant wavelengths and/or astrological bodies. These systems, at the surface level, will still need to contend with significant attenuation themselves since the atmosphere is highly absorbent in these bands.

Imaging in these particular wavelength bands or ranges can be controlled using illumination provided, for example, directly by a light source associated with the imaging system. Variations caused by solar radiation and/or certain weather conditions, such as glints, glares, haze, fog, or the differences in illumination of a particular scene captured during the day or at night, are thus avoided when using images generated using incident light from the identified wavelength bands. The task of object detection, including training of the appropriate system using machine learning techniques, becomes a less complicated task absent these variations.

Figure 1:
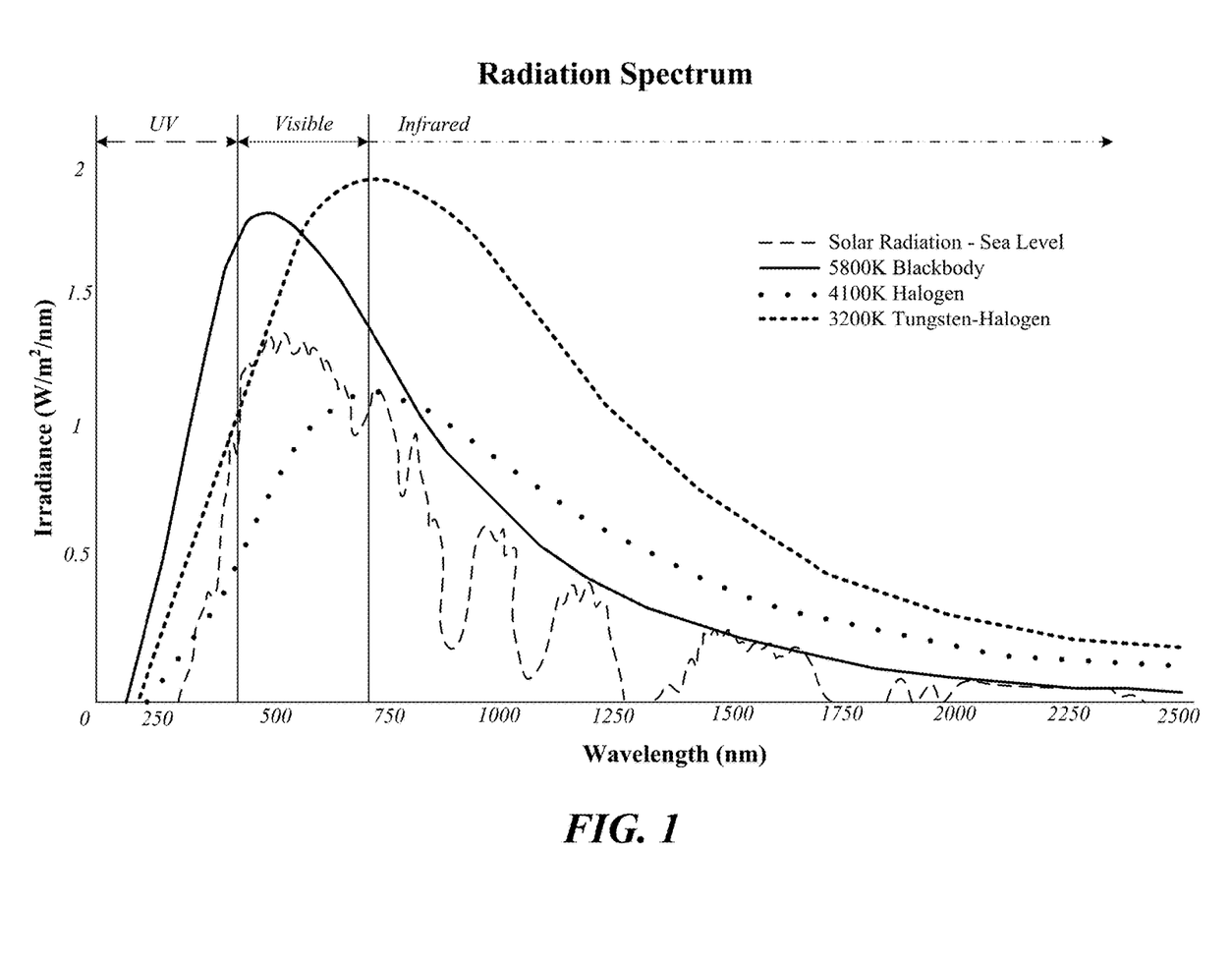
FIG. 1 is a graphical representation of spectral irradiance versus wavelength for a variety of radiation sources.

FIG. 1 is a graphical representation of spectral irradiance (Watts (W) per square meter ($m^2$) per nanometer (nm) vs. wavelength (nm)) for a variety of radiation sources. Separation between different portions of the radiation spectrum is indicated using vertical lines and labeled as applicable: ultraviolet (UV), visible, and infrared, including all types or forms of electromagnetic radiation. The term "light" is used within this description to indicate any form of electromagnetic radiation across the radiation spectrum. Specific descriptions and labels for light, such as light within the visible spectrum, light within the infrared spectrum, UV light, visible light, and infrared light, are used to indicate specific wavelengths of a given radiation source.

Solar radiation is shown using a long-dashed line. When generating images using light in the visible spectrum, or visible light, solar radiation can generate blind spots or bright spots due to solar artifacts, reflections, glints, fascia scatter, and/or solar scattering. When generating images using light in the infrared spectrum, or infrared light, solar radiation may cause a thermal or heat signature of an object to differ depending on a time of day or night and exposure to solar radiation. As solar radiation passes through the Earth's atmosphere, some wavelengths are absorbed by gases with specific absorption bands such that particular wavelengths of solar radiation are fully absorbed at the Earth's surface. The absorbed wavelengths of solar radiation include a range surrounding 1350 nm (e.g., approximately 40 nm to 100 nm wide) and a range surrounding 1875 nm (e.g., approximately 70 nm to 130 nm wide), both of which are in the near-infrared or infrared spectrum. Full absorption in these ranges is shown on the graph by the dip to zero irradiance for solar radiation at approximately 1350 nm and 1875 nm.

The irradiance by wavelength for three additional radiation sources is shown on the graph of FIG. 1 as a function of temperature in kelvin (K). 5800K Blackbody radiation is shown using a solid line. 4100K Halogen radiation is shown using circular point representations. 3200K Tungsten-Halogen radiation is shown using short-dashed representations. All three of these non-solar radiation sources are present (not absorbed) and available for use by an imaging system in the ranges surrounding 1350 nm and 1875 nm where solar radiation is absent. Hence, 5800K Blackbody, 4100K Halogen, and/or 3200K Tungsten-Halogen could serve as an illumination source for an imaging system that produces images isolated from solar radiation. Other non-solar radiation sources (not shown) are also possible. For example, near-infrared light-emitting diode (LED), incandescent, laser, or any other blackbody or near blackbody source has significant radiation in the specified wavelength bands or ranges.

Figure 2:
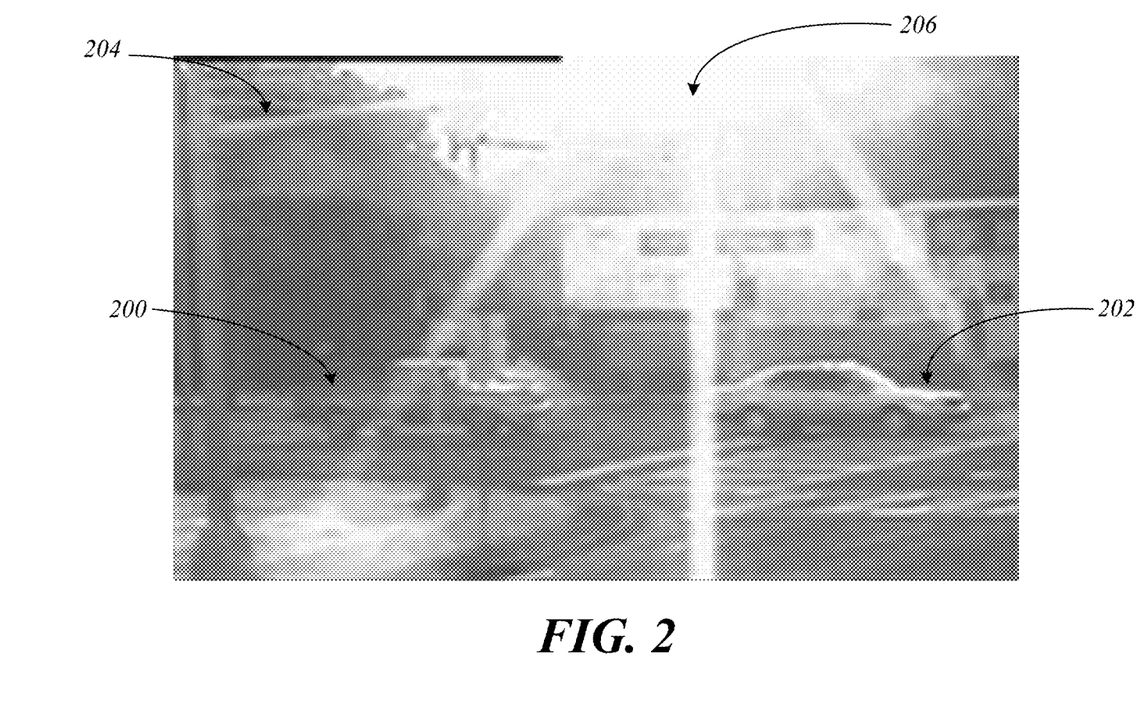
FIG. 2 shows an example of an image of a scene generated using light from a visible spectrum.

FIG. 2 shows an example of an image of a scene generated using light from a visible spectrum, or visible light. An imaging system (not shown) can be controlled to capture incident light in the visible spectrum using, for example, an image sensor such as a charge-coupled device (CCD) or a complementary metal oxide semiconductor (CMOS). Other image sensors can also be used to capture light in the visible spectrum.

The scene in FIG. 2 is viewed from a vantage point of a vehicle approaching an intersection (not shown). Two additional vehicles, a truck 200 on the left and a car 202 on the right, are also approaching (or already entering) the intersection. Though it appears that a traffic signal 204 of some sort is present at the intersection, no details of a state of the traffic signal 204 are discernable within the image due to the presence of a bright spot 206 at a top right corner of the image. The bright spot 206, potentially caused by the presence or reflection of solar radiation from the sun in the sky on a sunny day, completely obscures any indication associated with the traffic signal 204. Thus, an object detection algorithm used to identify a state of the traffic signal 204 would face difficulty when supplied with the scene in FIG. 2.

Building a perception database for object detection in order to train an object detection algorithm is complicated when using images generated using incident light in the visible spectrum. One reason for this difficulty is variations caused by solar radiation, such as the bright spot 206 shown in the image of the scene in FIG. 2. Accounting for different lighting conditions and solar artifacts will greatly expand the library requirements for an object detection algorithm when working with images generated based on solar radiation in the visible spectrum.

Figure 3:
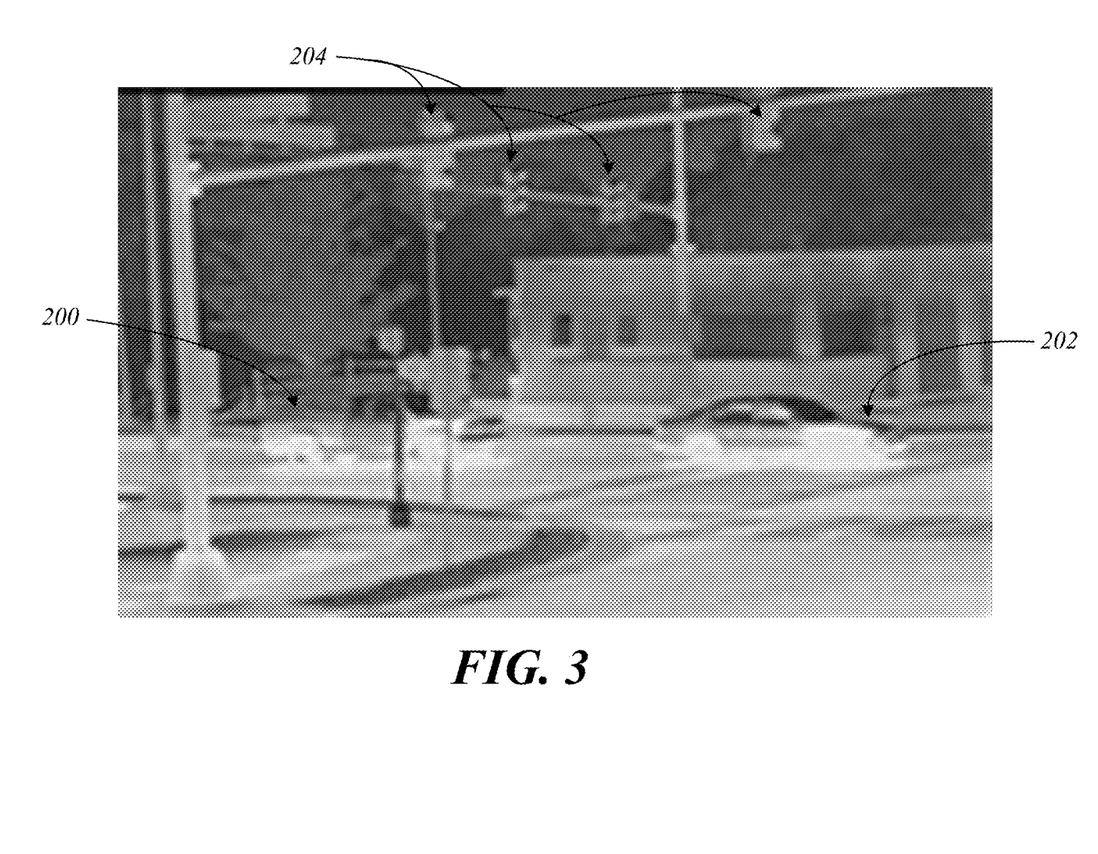
FIG. 3 shows an example of an image of the scene of FIG. 2 generated using light from an infrared spectrum.

FIG. 3 shows an example of an image of the scene of FIG. 2 generated using light from an infrared spectrum, or infrared light. An imaging system (not shown) can be controlled to capture incident light in the infrared spectrum by leveraging a light source that illuminates at least a portion of the scene, an image sensor that can be controlled to capture a portion of incident light in the infrared spectrum, and a filter that allows the portion of incident light to enter one or more pixels of the image sensor.

The light source for the imaging system can be, for example, tungsten, halogen, incandescent, blackbody, near blackbody, infrared, near-infrared LED, or laser. Other infrared or near-infrared light sources are also possible. Many light sources that operate in the infrared spectrum are not visibly detectable by humans, allowing the imaging system to avoid being a nuisance, for example, to other vehicles or pedestrians nearby a vehicle leveraging the described imaging system.

As one example, the image sensor capturing incident light in the infrared spectrum for the imaging system can be an Indium Gallium Arsenide (InGaAs) sensor such as those used in short-wave infrared (SWIR) imaging systems. Other suitable image sensors for capturing light in the infrared spectrum include Germanium (Ga) cameras, phosphor coated CCD detectors, and phosphor coated CMOS silicon detectors. Other image sensors and/or scanning-type detectors can also be used to capture light in the infrared spectrum for the imaging system.

The filter for the imaging system can be designed to partially or fully isolate the image sensor from solar radiation. In one example of a filter, the filter can allow a predetermined wavelength of incident light to enter one or more pixels of the image sensor, such as light having a 1350 nm and/or an 1875 nm wavelength. The filter can also be designed to allow light having a range of wavelengths to enter one or more pixels of the image sensor, such as 40 nm to 130 nm bands of light inclusive of light having a 1350 nm and/or an 1875 nm wavelength. By capturing 20 nm to 50 nm bands of light, a small amount of solar radiation can be used to supplement the powered light source while avoiding most solar artifacts, lessening the power needs of the light source, for example, during daytime image capture.

In another example of a filter, the filter can allow a first predetermined wavelength of incident light to enter a first pixel of the image sensor, for example, light having a wavelength of 1250 nm, 1350 nm, 1450 nm, or 1550 nm. The filter can also allow a second predetermined wavelength of incident light to enter a second pixel of the image sensor. The second predetermined wavelength can be a different wavelength than the first predetermined wavelength, for example, light having a different one of the wavelengths from the group of 1250 nm, 1350 nm, 1450 nm, and 1550 nm. Other filters that lessen or isolate the image sensor from solar radiation are also possible.

In the example where the filter allows different wavelengths of incident light to enter different pixels of the image sensor, the filter can be designed with a modified Bayer pattern, and object detection can be accomplished using pixel to pixel computations. A pattern-style filter of this type also allows the imaging system to be used to learn and/or identify weather conditions such as fog, ice, rain, snow, dust, etc. based on differential comparisons between images captured at different wavelengths.

Capture of solar invariant wavelengths of incident light in the infrared wavelengths of interest is often associated with higher expense due to the traditional use of higher resolution, larger arrays to gain a desired effect in output images. However, lower resolution, smaller, less expensive arrays can be leveraged in the imaging systems described in this disclosure based on controlled illumination and noise elimination using one of the various described filtering mechanisms.

The image of the scene in FIG. 3 is taken under the same solar radiation conditions, at the same time, and from the same vantage point of the vehicle approaching the intersection (not shown) as the image of the scene in FIG. 2. However, the image in FIG. 3 is generated using filtered light from the infrared spectrum, for example, in a range or band surrounding a 1350 nm wavelength. In this example, the truck 200 is again visible on the left, and the car 202 is again visible on the right, just as in the image of the scene in FIG. 2. However, there is no bright spot such as the bright spot 206 of FIG. 2, and various traffic lights forming part of the traffic signal 204 are now discernable within the image. Thus, an object detection algorithm can be used to identify a state of the traffic signal 204 using the image of the scene shown in FIG. 3. This type of object detection would not have been possible using the image of the scene shown in FIG. 2.

Figure 4:
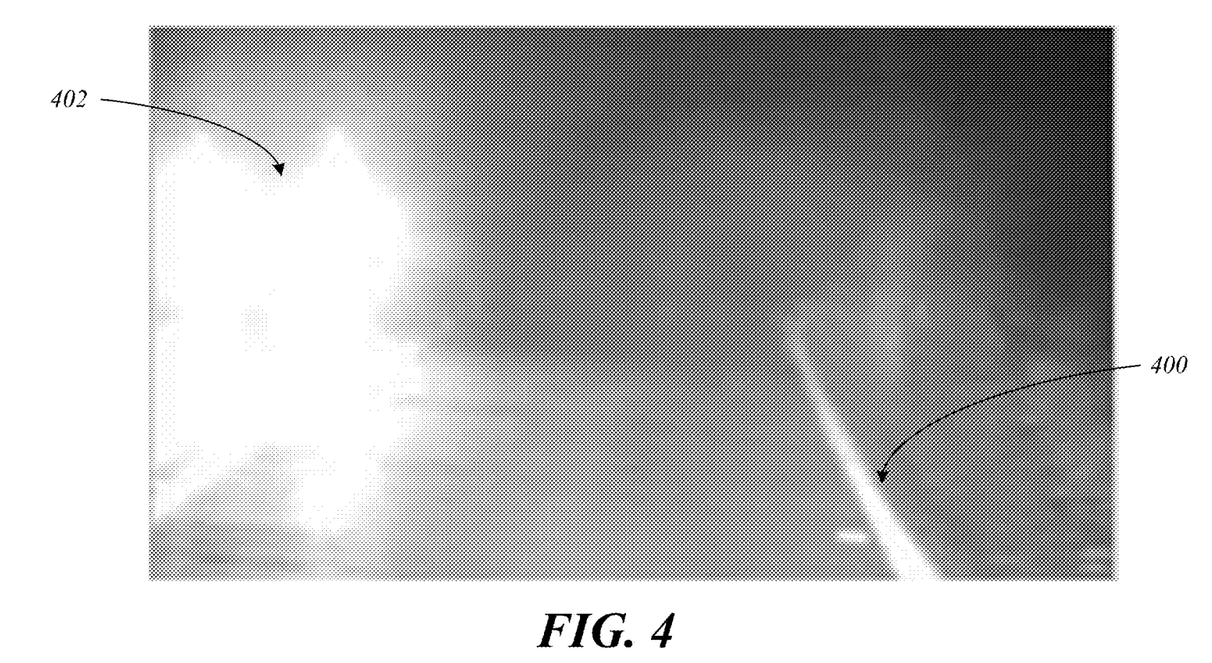
FIG. 4 shows an example of an image of another scene generated using light from a visible spectrum.

FIG. 4 shows an example of an image of another scene generated using light from a visible spectrum, or visible light. Again, an imaging system (not shown) can be controlled to capture incident light in the visible spectrum using, for example, an image sensor such as a CCD or a CMOS. Other image sensors can also be used to capture light in the visible spectrum.

The scene in FIG. 4 is viewed from a vantage point of a vehicle traveling along a road (not shown) during hazy or foggy conditions. A lane line 400 is visible on a right side of the image, indicating a right edge of the road, but a left edge of the road is not discernable in the image due to the presence of a bright spot 402. The bright spot 402, which can be caused by headlamps of another vehicle or reflections of solar radiation off another vehicle, completely obscures the left edge of the road.

The hazy or foggy conditions worsen the obscuring effect of the bright spot 402 and make the use of natural solar radiation for imaging difficult based on a low emissivity of light in the visible spectrum through weather conditions such as fog and haze. Weather conditions such as rain, snow, and dust can also negatively impact an object detection algorithm relying on images generated using light in the visible spectrum. Given the conditions present in the example of the image of the scene in FIG. 4, an object detection algorithm would face difficulty in detecting any objects other than the lane line 400 on the right side of the image.

Figure 5:
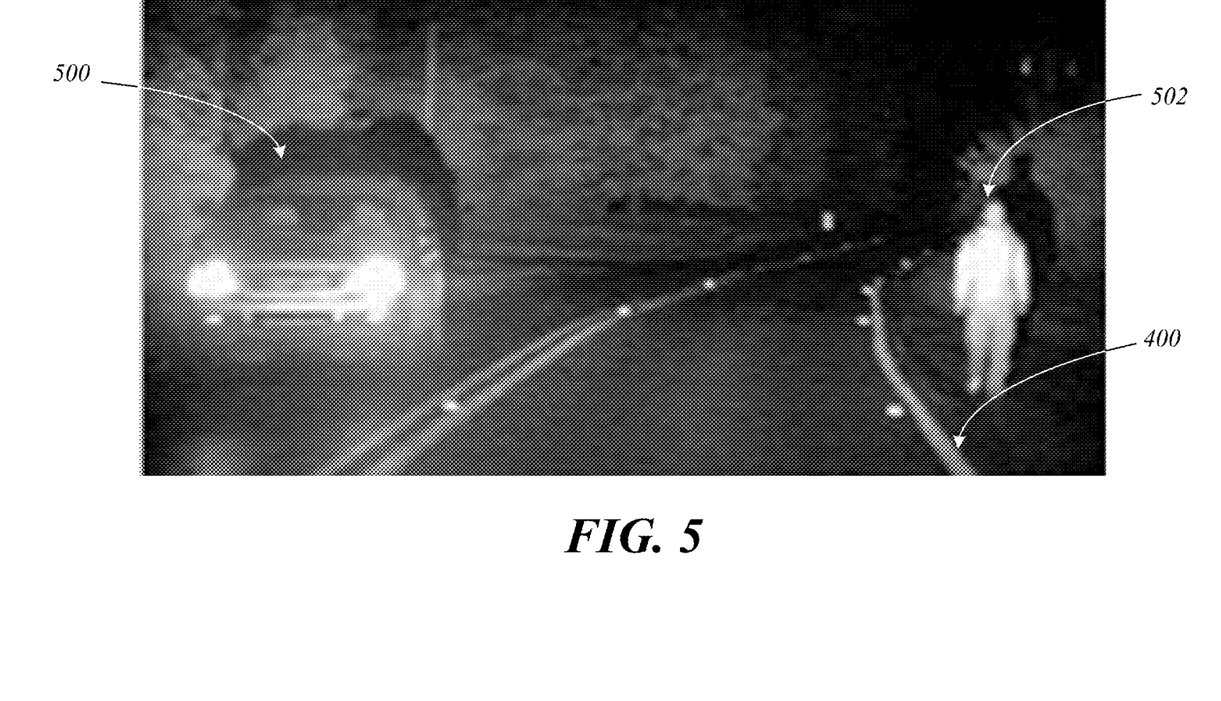
FIG. 5 shows an example of an image of the scene of FIG. 4 generated using light from an infrared spectrum.

FIG. 5 shows an example of an image of the scene of FIG. 4 generated using light from an infrared spectrum, or infrared light. An imaging system (not shown) can be controlled to capture incident light in the infrared spectrum by leveraging a light source that illuminates at least a portion of the scene, an image sensor that can be controlled to capture a portion of incident light in the infrared spectrum, and a filter that allows the portion of incident light to enter one or more pixels of the image sensor. The light source, the image sensor, and the filter can function in a manner as described in respect to FIG. 3.

The image of the scene in FIG. 5 is taken under the same hazy or foggy conditions, under the same solar radiation conditions, at the same time, and from the same vantage point of the vehicle traveling along the road shown in FIG. 4. However, the image in FIG. 5 is generated using filtered light from the infrared spectrum, for example, in a range or band surrounding an 1875 nm wavelength. In this example, the lane line 400 is again visible on the lower right side of the image. However, there is no bright spot such as the bright spot 402 of FIG. 3, and the obscuring effects of fog and/or rain are not present. Instead, another vehicle 500 and a pedestrian 502 are now discernable within the image. Thus, an object detection algorithm can use the image of the scene shown in FIG. 5 to identify both the vehicle 500 and the pedestrian 502. This type of object detection would not have been possible using the image of the scene shown in FIG. 4.

Figure 6A:
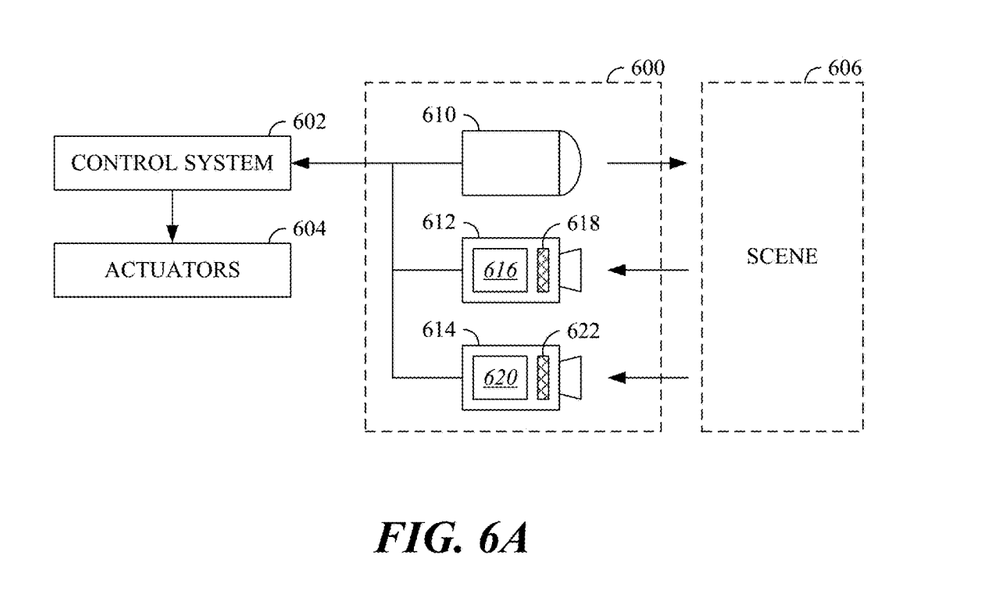
FIG. 6A is a block diagram showing an imaging system, a control system, and actuators according to a first example.

FIG. 6A is a block diagram showing an imaging system 600, a control system 602, and actuators 604 according to a first example, which can be incorporated in a vehicle. The imaging system 600 is operable to output images that represent a scene 606. The scene 606 is, for example, part of an environment near a vehicle.

The images from the imaging system 600 are utilized as inputs to the control system 602. The control system 602 analyzes some or all of the images that are received from the imaging system 600 to detect objects that are present in the scene 606. The objects can be, as examples, roadway features or obstacles. Examples of roadway features include lane lines and lane edges. Examples of obstacles include vehicles, barriers, and debris. The locations of the objects detected in the scene 606 by the control system 602 are utilized by the control system 602 as inputs that support automated vehicle control functions. For example, the control system 602 can determine a trajectory based in part on the presence and location of the detected objects in the environment around the vehicle. As an output, the control system 602 determines and sends one or more commands to one or more vehicle systems, such as the actuators 604. As examples, the actuators 604 can include one or more of propulsion actuators, steering actuators, braking actuators, and suspension actuators. Thus, at least one vehicle system, such as one of the actuators 604, is controlled based in part on the object detected by the control system 602 using the images that were provided to the control system 602 by the imaging system 600.

The imaging system includes a light source 610, a first imaging device 612, and a second imaging device 614. The light source 610 is able to illuminate the scene with light that is outside of the visible spectrum, such as light in at least a portion of the infrared spectrum and/or the near-infrared spectrum. The light source 610 can incorporate lighting elements such as tungsten, halogen, incandescent, blackbody, near blackbody, infrared, near-infrared LED, or laser. The first imaging device 612 includes a first image sensor 616 and may include a first filter 618. The first image sensor 616 captures incident light in the visible spectrum from the scene 606, and can be any type of image sensing device that is sensitive to light in the visible spectrum, such as a CCD or a CMOS. The first filter 618 may block transmission of certain wavelengths of electromagnetic radiation from reaching the first image sensor 616. As an example, the first filter 618 may block transmission of light that is outside of the visible spectrum. The second imaging device 614 includes a second image sensor 620 and may include a second filter 622. The second image sensor 620 captures incident light in the visible spectrum from the scene 606, and can be any type of image sensing device that is sensitive to light in the infrared spectrum and/or near-infrared spectrum, such as an InGaAs sensor. The second image sensor 620 is sensitive to at least some of the illumination provided to the scene 606 by the light source 610. The second filter 622 may block transmission of certain wavelengths of electromagnetic radiation from reaching the second image sensor 620. As an example, the second filter 622 may block transmission of light that is outside of the infrared spectrum.

Figure 6B:
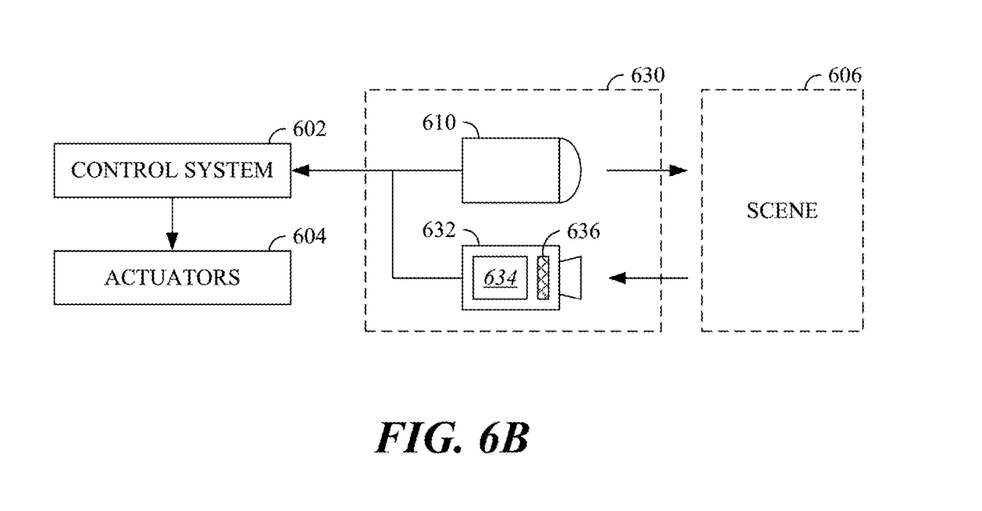
FIG. 6B is a block diagram showing an imaging system, a control system, and actuators according to a second example.

FIG. 6B is a block diagram showing an imaging system 630, the control system 602, and the actuators 604 according to a second example, which can be incorporated in a vehicle. The control system 602 and the actuators 604 are as described with respect to FIG. 6A. The imaging system 630 is similar to the imaging system 600, and the description of the imaging system 600 applies to the imaging system 630, except as noted herein.

The imaging system includes the light source 610 and an imaging device 632. The light source 610 is as described with respect to FIG. 6A. The imaging device 632 includes an image sensor 634 and a compound filter 636. The imaging device 632 is operable to capture incident light in the visible spectrum and incident light that is outside the visible spectrum, in particular, light in the infrared spectrum and/or near-infrared spectrum.

The compound filter 636 includes first filter portions that pass a first range of wavelengths of electromagnetic radiation and may block passage of electromagnetic radiation outside of the first range of wavelengths. The first range of wavelengths corresponds to at least a portion of the visible spectrum. The first filter portions may pass light in a manner that is analogous to passage of light as described for the first filter 618 of the imaging system 600.

The compound filter 636 includes second filter portions that pass a second range of wavelengths of electromagnetic radiation and may block passage of electromagnetic radiation outside of the second range of wavelengths. The second range of wavelengths corresponds to at least a portion of the infrared spectrum and/or the near-infrared spectrum. The second filter portions may pass light in a manner that is analogous to passage of light as described for the second filter 622 of the imaging system 600.

The first filter portions of the compound filter 636 pass light to first areas of the image sensor 634, corresponding to a first group of pixels of the resulting image. The second filter portions of the compound filter 636 pass light to second areas of the image sensor 634, corresponding to a second group of pixels of a resulting compound image. The first group of pixels and the second group of pixels can be arranged in any desired pattern, such as a checkerboard pattern, alternating rows, or alternating columns. The compound image can be interpreted by the control system 602 to define a first image representing visible light and a second image representing light in the infrared spectrum and/or the near-infrared spectrum.

Figure 7:
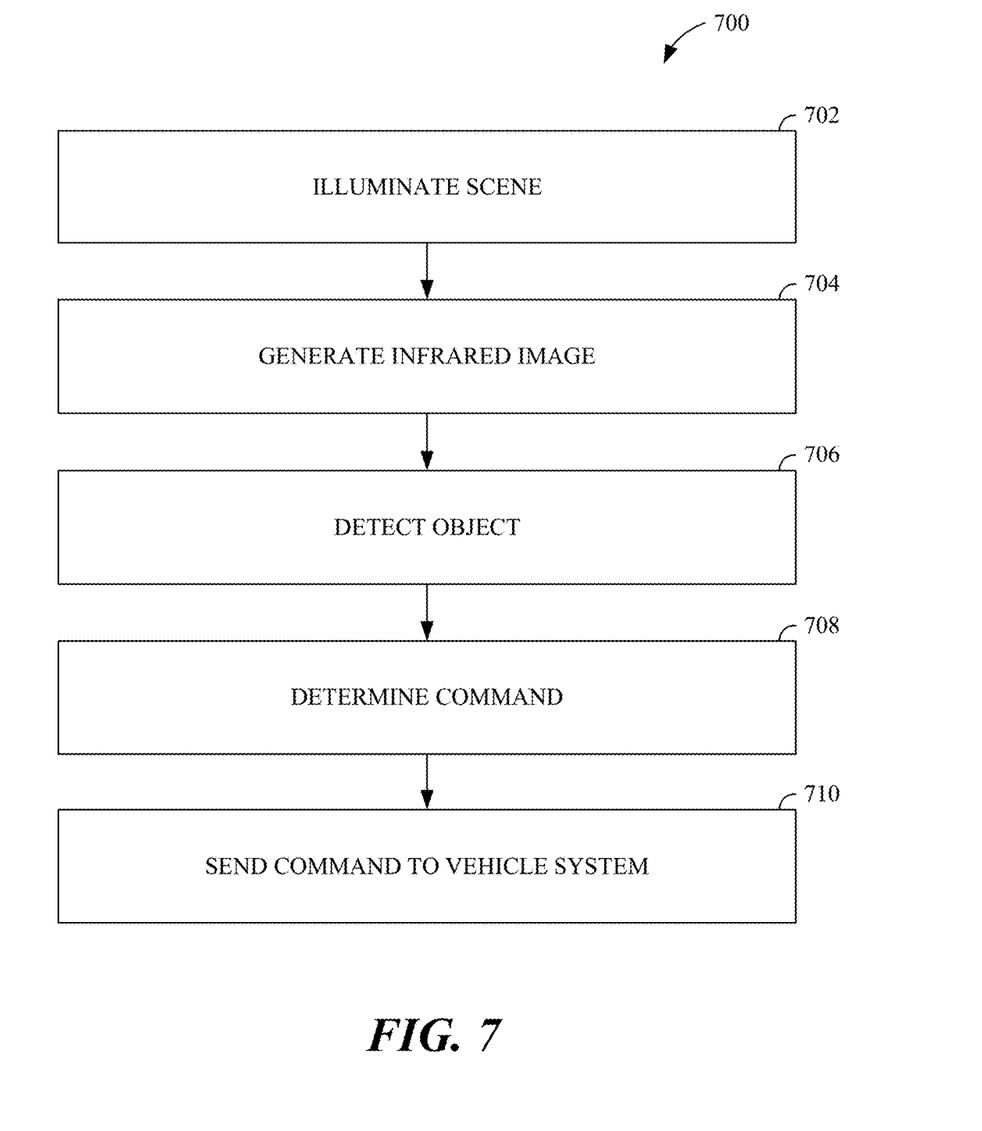
FIG. 7 is a flow chart of a first method of object detection.

FIG. 7 is a flow chart of a first method 700 of object detection, for example, for use with a vehicle-based imaging system. As an example, the first method 700 of object detection can be implemented using the imaging system 600 and the control system 602.

In operation 702, the imaging system can illuminate a scene. The scene is illuminated using a non-visible light source that provides light in the infrared spectrum and/or the near infrared spectrum. As an example, a near-infrared light source can be used to illuminate a scene in operation 702. Operation 702 can be performed in the manner described in connection with illumination of the scene 606 by the light source 610. In operation 704, an infrared image is generated. The infrared image is generated using an image sensor that is sensitive to light in the infrared spectrum and/or the near-infrared spectrum. In one implementation, operation 704 can be performed using an imaging system that generates an image based on incident light captured in a band of an infrared spectrum, the band having a width of 130 nm or less, and the band including at least one of 1250 nm, 1350 nm, 1450 nm, and 1550 nm wavelengths. For example, the image can be generated by the imaging system based on incident light from the infrared light source captured in a portion of an infrared spectrum that is characterized by full absorption of solar radiation. In addition, the image can be generated by the imaging system based on incident light from the infrared light source captured only in a portion of an infrared spectrum that is characterized by full absorption of solar radiation. In some implementations, illuminating the scene includes modulating the wavelength of the illumination within the band of the infrared spectrum so that the illumination produced in operation 702 can be differentiated from other illumination sources. As an example, the infrared image can be generated in the manner described in connection with the second imaging device 614.

In operation 706, an object is detected using the image that was generated in operation 704. The object is detected using a control system that executes an image detection function, using machine vision techniques, such as by extracting and classifying features in the image. The object can be detected, for example, as described with respect to the control system 602. In operation 708, a command is determined based on the object that was detected in operation 706. As an example, the command can cause operation of the vehicle in a manner that avoids contact with the object. The command can be determined as described with respect to the control system 602.

In operation 710, a vehicle system is controlled using the command determined in operation 708, which is based on the location of the object identified in operation 706 using the image from operation 704. Control of a vehicle system in operation 710 can be as described with respect to the actuators 604. After operation 710, the first method 700 ends. Additional iterations of the first method 700 can optionally be performed.

Figure 8:
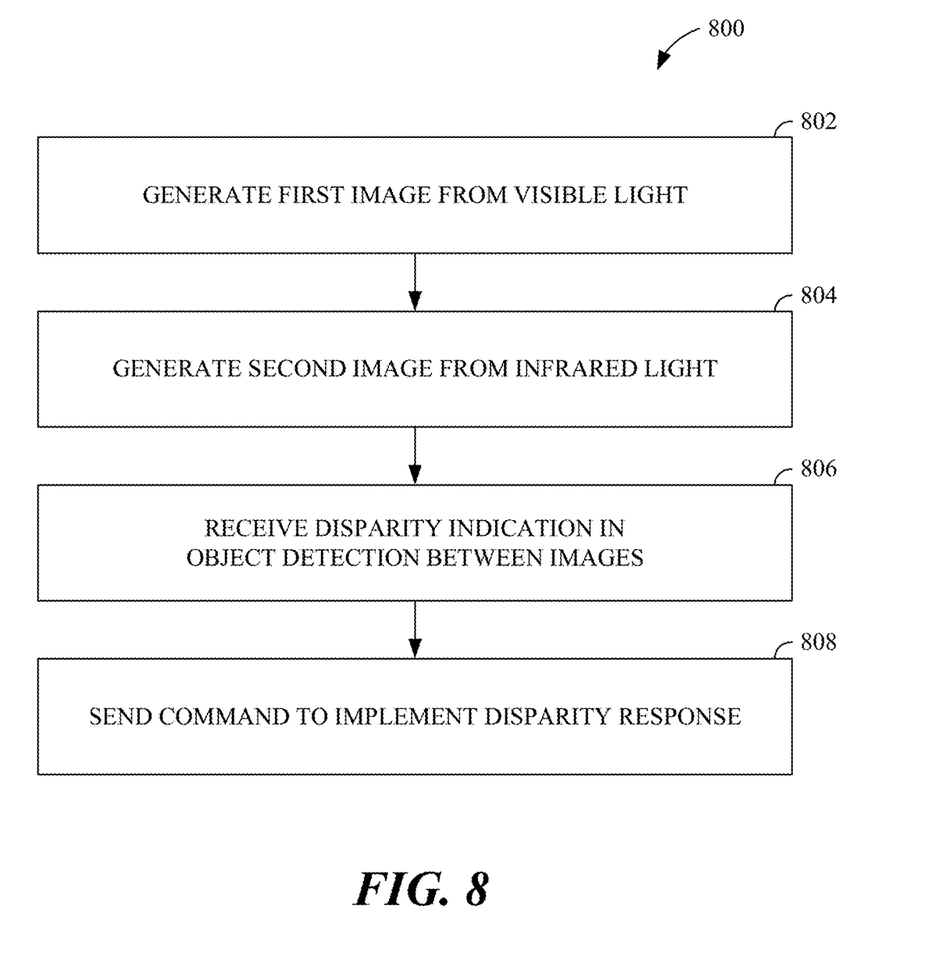
FIG. 8 is a flow chart of a second method of object detection.

FIG. 8 is a flow chart of a second method 800 of object detection, for example, for use with a vehicle-based imaging system. As an example, the second method 800 of object detection can be implemented using the imaging system 600 and the control system 602.

In operation 802, the imaging system can generate a first image based on incident light captured in a visible spectrum. The imaging system can include an image sensor, for example, a CCD image sensor or a CMOS image sensor that captures incident light in the visible spectrum. The first image can include unintended artifacts caused, for example, by solar radiation, weather conditions, and/or other radiation sources similar to the artifacts described in reference to the images of the scenes in FIG. 2 and FIG. 4.

In operation 804, the imaging system can generate a second image based on incident light captured in an infrared spectrum. The imaging system can include a light source that illuminates a portion of a scene using light from the infrared spectrum, an image sensor that captures a portion of incident light in the infrared spectrum from the illuminated portion of the scene, and a filter that allows the portion of incident light to enter one or more pixels of the image sensor. The light source can generate and the filter can isolate ranges or bands of wavelengths that are unaffected by solar radiation on the Earth's surface. For example, the light source can be tungsten-halogen, near-infrared LED, halogen, incandescent, laser, blackbody, or near blackbody, and the filter can be designed to allow wavelengths at or around 1350 nm and/or 1875 nm to be captured by the image sensor.

In operation 806, a control system, for example, a vehicle controller, can receive a disparity indication associated with object detection. The disparity indication can include information that an object, such as a moving vehicle, a pedestrian, a traffic signal, etc., is not properly, fully, and/or accurately detected in either the first image of operation 802 or the second image of operation 804. In other words, the disparity indication can include information that represents a disagreement in object detection between the first image and the second image. Since the first image and the second image are generated using light from different portions of the radiation spectrum, this disparity indication can highlight the presence of artifacts caused by solar radiation or weather conditions that may adversely impact object detection.

FIGS. 2 and 3 provide one example of a disparity. The traffic signal 204 can be identified by an object detection algorithm as a pole near the intersection in the captured image of the scene of FIG. 2. The traffic signal 204 can be identified by the object detection algorithm as two pairs of traffic lights on a pair of poles near the intersection in the captured image of the scene of FIG. 3. Further, states of at least some of the traffic lights (e.g., whether red, yellow, or green indicator lights are lit) can be determined by the object detection algorithm in the captured image of the scene of FIG. 3. As the object detection algorithm does not identify the same presence, form, and/or state of the traffic signal 204 in the images of the scenes of FIGS. 2 and 3, a disparity indication can be generated based on this information and sent to the control system.

FIGS. 4 and 5 provide another example of a disparity. The lane line 400 and the bright spot 402 can be identified by an object detection algorithm in the captured image of the scene of FIG. 4. The lane line 400, the vehicle 500, and the pedestrian 502 can be identified by an object detection algorithm in the captured image of the scene of FIG. 5. As the object detection algorithm does not identify the same presence, form, and/or state of the vehicle 500 and the pedestrian 502 in the images of the scenes of FIGS. 4 and 5, a disparity indication can be generated based on this information and sent to the control system.

In operation 808, the control system, for example, the vehicle controller, can send a command to one or more vehicle systems to implement a disparity response based on the disparity indication. The disparity response can take a variety of forms. For example, the vehicle controller can direct the imaging system to perform object detection using a third image separate from the first image and the second image described in operation 802 and operation 804. The third image can be captured from another vantage point by another image sensor, or can be captured at a subsequent time from a time of capture of the first image and the second image using the same vantage point. Other capture scenarios for the third image are also possible.

In another example of a disparity response, the vehicle controller can send a command to a vehicle system to modify vehicle behavior. For example, the vehicle controller can send a command to a braking system to decrease a speed of the vehicle. In another example, the vehicle controller can send a command to a steering system to modify a path of the vehicle. Other modifications in vehicle behavior are also possible. This type of disparity response can allow additional time for object detection, classification, and/or response using additional components or actions of the imaging system. After operation 808, the second method 800 ends. Additional iterations of the second method 800 can optionally be performed.

Though many examples in this disclosure relate to improvements in object detection, for example, for use in vehicle navigation, the same imaging techniques can be used to determine whether a cover or a fascia of an imaging system requires cleaning or replacement. Images generated from incident light captured in the solar-invariant regions inclusive of 1350 nm and 1875 nm wavelengths highlight features such as cracks, dust, debris, etc. in transparent or near-transparent objects. Thus, an imaging system with the above-described illumination and filtering capabilities can serve to improve other sensing systems associated with the vehicle.

Figure 9:
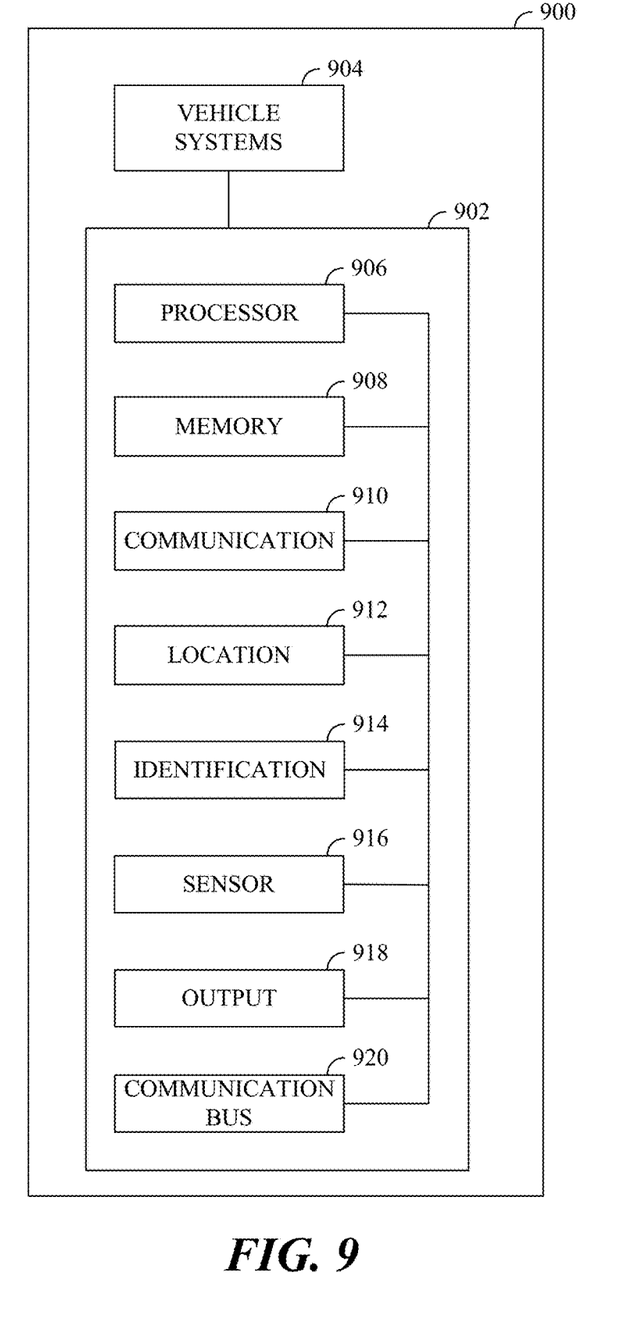
FIG. 9 is a diagram of an example of a controller apparatus.

FIG. 9 is a schematic diagram of a vehicle 900 in which the various methods, aspects, features, systems, and elements disclosed here can be implemented. The vehicle 900 can be manually operated, semi-autonomous, fully autonomous, or combinations thereof. The vehicle 900 includes a controller 902 which can be used for communication, command, and/or control of various vehicle systems 904 or combinations of vehicle systems 904.

The controller 902 can include any combination of a processor 906, a memory 908, a communication component 910, a location component 912, an identification component 914, a sensor component 916, an output component 918, and/or a communication bus 920.

The processor 906 can execute one or more instructions such as program instructions stored in the memory 908. As an example, the processor 906 can include one or more: central processing units (CPUs); general purpose processors with one or more processing cores; special purpose processors with one or more cores; digital signal processors (DSPs); microprocessors; controllers; microcontrollers; integrated circuits; Application Specific Integrated Circuits (ASIC); Field Programmable Gate Arrays (FPGA); or programmable logic controllers.

The memory 908 can include a tangible non-transitory computer-readable medium that can be used to store program instructions such as computer-readable instructions, machine-readable instructions, or any type of data that can be used by the processor 906. As an example, the memory 908 can include any computer readable media that can be accessed by the processor 906, such as read only memory (ROM) or random access memory (RAM). Further, the memory 908 can include volatile memory or non-volatile memory such as: solid state drives (SSDs), hard disk drives (HDDs), dynamic random access memory (DRAM); or erasable programmable read-only memory (EPROM).

The communication component 910 can be used to transmit or receive signals, such as electronic signals, via a wired or wireless medium. As an example, the communication component 910 can transmit or receive signals such as radio frequency (RF) signals which can be used to transmit or receive data that can be used by the processor 906 or stored in the memory 908. The communication component 910 can include a local area network (LAN), a wide area network (WAN), a storage area network (SAN), a virtual private network (VPN), a cellular telephone network, or the Internet. The communication component 910 can transmit or receive data using a communication protocol such as transmission control protocol (TCP), user Datagram protocol (UDP), Internet protocol (IP), real-time transport protocol (RTP), or hypertext transport protocol (HTTP).

The location component 912 can generate navigation data or geolocation data that can be used to determine a velocity, an orientation, a latitude, a longitude, or an altitude for the vehicle 900. The location component 912 can include one or more navigation devices that are able to use navigational systems such as a global positioning system (GPS), the long range navigation system (LORAN), the Wide Area Augmentation System (WAAS), or the global navigation satellite system (GLONASS).

The identification component 914 can include specialized instructions for: operating the vehicle 900; communicating with remote data sources; determining the state of the vehicle 900; or determining the state or identity of extra-vehicular objects. In some implementations, a portion of the memory 908 can be coupled to the identification component 914 via the communication bus 920.

The sensor component 916 can include one or more sensors that detect the state or condition of the physical environment either internal or external to the vehicle 900. In some implementations, the sensor component 916 includes one or more of: an accelerometer, a gyroscope, a still image sensor, a video image sensor, an infrared sensor, a near-infrared sensor, a LIDAR system, a radar system, a sonar system, a thermometer, a barometer, a moisture sensor, a vibration sensor, a capacitive input sensor, or a resistive input sensor.

As examples, the sensor component 916 can detect the state of stationary or moving objects external to the vehicle 900 including: physical structures such as buildings; vehicles such as automobiles and motorcycles; or non-vehicular entities such as pedestrians and vehicle drivers. Based on the sensory input detected by the sensor component 916, the sensor component 916 can generate sensor data that can be used to: operate the vehicle 900; determine the state or condition of the vehicle 900; or determine the state or condition of objects external to the vehicle 900.

The output component 918 can include one or more output devices that can be used to generate outputs including sensory outputs such as visual outputs, audible outputs, haptic outputs, or electrical outputs. The one or more output devices can include: visual output components that illuminate portions of the environment surrounding the vehicle 900, display components that display still images or video images such as a liquid crystal display (LCD), an organic light-emitting diode (OLED) display, or a cathode ray tube (CRT) display; audio output components such as loudspeakers; or haptic output components to produce vibrations or other types of tactile outputs.

The communication bus 920 can include an internal bus or an external bus and can be used to couple any combination of the processor 906, the memory 908, the communication component 910, the location component 912, the identification component 914, the sensor component 916, or the output component 918. As an example, the communication bus 920 can include one or more buses such as: a peripheral component interconnect (PCI), Serial AT attachment (SATA), a HyperTransport (HT) bus, or a universal serial bus (USB).

The vehicle systems 904 can include imaging systems, battery systems, powertrain systems, transmission systems, braking systems, steering systems, suspension systems (not shown), or any other systems used to interact with the environment surrounding the vehicle and/or cause or control movement of the vehicle 900.

What is claimed is:

1. An object detection system, comprising:
    an imaging system that:
        generates a first image based on incident light captured in a visible spectrum; and
        generates a second image based on incident light captured in an infrared spectrum; and
    a control system that:
        receives a disparity indication associated with object detection, wherein the disparity indication includes information that an object is not detected within the first image and that the object is detected within the second image; and
        sends a command to one or more vehicle systems to implement a disparity response based on the disparity indication.

2. The object detection system of claim 1, wherein the imaging system comprises:
    a first image sensor that captures incident light in the visible spectrum; and
    a second image sensor that captures incident light in the infrared spectrum.

3. The object detection system of claim 2, wherein the first image sensor includes at least one of a charge-coupled device (CCD) or a complementary metal oxide semiconductor (CMOS) and the second image sensor includes an indium gallium arsenide (InGaAs) sensor.

4. The object detection system of claim 1, wherein the disparity response includes performing object detection using a third image separate from the first image and the second image.

5. The object detection system of claim 1, wherein the disparity response includes causing one or more vehicle systems to decrease a speed of a vehicle or change a path of the vehicle.

6. The object detection system of claim 1, wherein the imaging system, comprises:
    a light source that illuminates a portion of a scene;
    an image sensor that captures a portion of incident light in the infrared spectrum from the illuminated portion of the scene; and
    a filter that allows the portion of incident light to enter one or more pixels of the image sensor.

7. The object detection system of claim 6, wherein the light source is at least one of tungsten, halogen, incandescent, blackbody, near blackbody, infrared, near-infrared light emitting diode, or laser.

8. The object detection system of claim 6, wherein the portion of incident light is a predetermined wavelength of incident light of 1350 nm or 1875 nm.

9. The object detection system of claim 6, wherein the portion of incident light comprises a range of wavelengths of incident light.

10. The object detection system of claim 9, wherein the range comprises a 40 nm to 130 nm band inclusive of a wavelength of 1350 nm or 1875 nm.

11. The object detection system of claim 6, wherein the portion of incident light includes a first predetermined wavelength of incident light that enters a first pixel of the image sensor and a second predetermined wavelength of incident light that enters a second pixel of the image sensor.

12. The object detection system of claim 11, wherein the first predetermined wavelength and the second predetermined wavelength are different wavelengths selected from a group comprising: 1250 nm, 1350 nm, 1450 nm, and 1550 nm wavelengths.

13. An object detection and control system, comprising:
an infrared light source;
an imaging system that:
generates a first image by capturing incident light in a visible spectrum; and
generates a second image by capturing incident light from a portion of an infrared spectrum,
wherein the portion of the infrared spectrum comprises a band of the infrared spectrum having a width of 130 nm or less, and
wherein the band of the infrared spectrum includes at least one wavelength from the group of: 1250 nm, 1350 nm, 1450 nm, and 1550 nm; and
a control system that:
receives a disparity indication associated with object detection, wherein the disparity indication includes information that an object is not detected within the first image and that the object is detected within the second image; and
determines a command to implement a disparity response based on the disparity indication; and
an actuator, wherein the command causes operation of the actuator.

14. The object detection and control system of claim 13, wherein the imaging system includes a first image sensor that captures incident light in the visible spectrum and a second image sensor that captures incident light in the infrared spectrum.

15. The object detection and control system of claim 14, wherein the first image sensor includes at least one of a charge-coupled device (CCD) or a complementary metal oxide semiconductor (CMOS) and the second image sensor includes at least one of an indium gallium arsenide (InGaAs) sensor, a Germanium (Ga) camera, a phosphor coated CCD detector, or a phosphor coated CMOS silicon detector.

16. The object detection and control system of claim 13, wherein the light source is at least one of tungsten, halogen, incandescent, blackbody, near blackbody, infrared, near-infrared light emitting diode, or laser.

17. The object detection and control system of claim 13, wherein the disparity response includes performing object detection using a third image separate from the first image and the second image.

18. The object detection and control system of claim 13, wherein the disparity response includes causing one or more vehicle systems to decrease a speed of a vehicle or change a path of the vehicle.

19. An object detection system, comprising:
an infrared light source that illuminates a portion of a scene;
an image sensor that captures incident light from the infrared light source in a portion of an infrared spectrum from the illuminated portion of the scene, the portion of the infrared spectrum characterized by full absorption of solar radiation;
an imaging system that:
generates a first image based on incident light captured in a visible spectrum; and
generates a second image based on incident light captured by the image sensor in the portion of the infrared spectrum; and
a control system that:
receives a disparity indication that an object is not detected within the first image and that the object is detected within the second image;
determines a command for one of more vehicle systems based on the disparity indication; and
sends the command to the one or more vehicle systems.

20. The object detection system of claim 19, wherein the portion of the infrared spectrum includes at least one wavelength from the group of: 1250 nm, 1350 nm, 1450 nm, and 1550 nm.

* * * * *

UNITED STATES PATENT AND TRADEMARK OFFICE
CERTIFICATE OF CORRECTION

PATENT NO. : 10,397,497 B1
APPLICATION NO. : 16/055316
DATED : August 27, 2019
INVENTOR(S) : Jack E. Graves et al.

Page 1 of 1

It is certified that error appears in the above-identified patent and that said Letters Patent is hereby corrected as shown below:

On the Title Page

Please replace Item (57) Abstract with the following:

ABSTRACT

An object detection system includes an infrared light source and an imaging system that generates an image from a portion of the infrared spectrum characterized by full absorption of solar radiation. A control system detects an object using the image, determines a command based on a location of the object, and sends a command to one or more vehicle systems. Another object detection system includes an imaging system that generates a first image based on a visible spectrum and a second image based on an infrared spectrum. A control system receives a disparity indication associated with object detection and sends a command to one or more vehicle systems to implement a disparity response based on the disparity indication. The disparity indication includes information that an object is not detected within the first image and that the object is detected within the second image.

Signed and Sealed this
First Day of October, 2019

Andrei Iancu
*Director of the United States Patent and Trademark Office*